(12) United States Patent
Gu et al.

(10) Patent No.: US 10,097,266 B2
(45) Date of Patent: Oct. 9, 2018

(54) THRESHOLD ADJUSTMENT COMPENSATION OF ASYMMETRICAL OPTICAL NOISE

(71) Applicant: Futurewei Technologies, Inc., Plano, TX (US)

(72) Inventors: Liang Gu, San Jose, CA (US); Hung-Yi Lee, Cupertino, CA (US); Yuming Cao, Pleasanton, CA (US); Miao Liu, Shanghai (CN)

(73) Assignee: Futurewei Technologies, Inc., Plano, TX (US)

( * ) Notice: Subject to any disclaimer, the term of this patent is extended or adjusted under 35 U.S.C. 154(b) by 51 days.

(21) Appl. No.: 15/429,492

(22) Filed: Feb. 10, 2017

(65) Prior Publication Data

US 2018/0234183 A1    Aug. 16, 2018

(51) Int. Cl.
*H04B 10/69*      (2013.01)
*H04B 10/2507*    (2013.01)
(Continued)

(52) U.S. Cl.
CPC ....... *H04B 10/2507* (2013.01); *H03L 7/0807* (2013.01); *H04B 10/2504* (2013.01);
(Continued)

(58) Field of Classification Search
CPC ........................... H04B 10/695; H04B 10/697
See application file for complete search history.

(56) References Cited

U.S. PATENT DOCUMENTS 6,172,630 B1 *  1/2001  Nelson ................. H03M 3/34
                                                341/143
7,453,388 B1 * 11/2008  Gutnik ................ H04B 10/695
                                                341/155
(Continued)

FOREIGN PATENT DOCUMENTS

WO    WO-2010/065789 A2    6/2010
WO    WO-2013/042175 A1    3/2013

OTHER PUBLICATIONS

"International Applcation Serial No. PCT/CN2018/075788, International Search Report dated Mar. 30, 2018", 7 pgs.
(Continued)

*Primary Examiner* — Nathan Cors
(74) *Attorney, Agent, or Firm* — Schwegman Lundberg & Woessner, P.A.

(57) ABSTRACT

An optical data circuit includes threshold adjustment circuits to perform threshold adjustment compensation of asymmetrical optical noise. The optical data circuit includes an optical-to-electrical conversion circuit configured to produce first and second differential electrical data signals, at respective first and second electrical nodes, in response to an optical data signal. First and second digital-to-analog converter (DAC) circuits are each respectively coupled to the first and second electrical nodes and configured to respectively generate first and second adjustment signals. The first and second DAC circuits are configured to adjust the first and second differential electrical data signals such that a zero-crossing point of positive data is pulled up in response to the first adjustment signal and a zero-crossing point of negative data is pulled down in response to the second adjustment signal.

20 Claims, 7 Drawing Sheets

(51) Int. Cl.
*H04B 10/25* (2013.01)
*H03L 7/08* (2006.01)
*H04B 3/04* (2006.01)

(52) U.S. Cl.
CPC ......... *H04B 10/695* (2013.01); *H04B 10/697* (2013.01); *H04B 3/04* (2013.01)

(56) References Cited

U.S. PATENT DOCUMENTS

| | | | |
|---|---|---|---|
| 2005/0062530 A1* | 3/2005 | Bardsley | H03K 5/082 330/136 |
| 2006/0088130 A1 | 4/2006 | Omori | |
| 2008/0152358 A1 | 6/2008 | Uto | |
| 2015/0162992 A1* | 6/2015 | Groepl | H04B 10/6911 398/210 |
| 2015/0198647 A1* | 7/2015 | Atwood | G01R 31/028 324/548 |
| 2016/0099775 A1* | 4/2016 | Liu | H04B 10/2507 398/115 |

OTHER PUBLICATIONS

"International Applcation Serial No. PCT/CN2018/075788, Written Opinion dated Mar. 30, 2018", 4 pgs.
Raghavan, Bharath, et al., "A Sub-2 W 39.8-44.6 Gb/s Transmitter and Receiver Chipset With SFI-5.2 Interface in 40 nm CMOS", *IEEE Journal of Solid-State Circuits*, 48(12), (Dec. 2013), 3219-3228.

* cited by examiner

THRESHOLD ADJUSTMENT COMPENSATION OF ASYMMETRICAL OPTICAL NOISE

FIELD OF THE INVENTION

The present disclosure is related to an optical-to-electrical circuit, and in particular to adjusting a threshold voltage of an output of the optical-to-electrical circuit.

BACKGROUND

On optical fiber datalinks, optical noise is typically asymmetrical. In other words, an optical "1" bit typically contains more noise than an optical "0" bit. Thus, after optical-to-electrical conversion, the noise asymmetry results in an eye height of a differential "1" bit that is smaller than an eye height of a differential "0" bit. This may result in a higher bit error rate (BER) for the differential "1" bit as compared to the differential "0" bit. It is desirable to adjust the zero-crossing points of the incoming data in order to balance these eye heights of the differential bits.

SUMMARY

Various examples are now described to introduce a selection of concepts in a simplified form that are further described below in the detailed description. The summary is not intended to identify key or essential features of the claimed subject matter, nor is it intended to be used to limit the scope of the claimed subject matter.

In one example, an optical data circuit includes an optical-to-electrical conversion circuit configured to produce first and second differential electrical data signals, at respective first and second electrical nodes, in response to an optical data signal. A first digital-to-analog converter (DAC) circuit is coupled to the first electrical node and configured to generate a first adjustment signal. A second DAC circuit is coupled to the second electrical node and configured to generate a second adjustment signal, wherein the first and second DAC circuits are configured to adjust the first and second differential electrical data signals such that a zero-crossing point of positive data is pulled up in response to the first adjustment signal and a zero-crossing point of negative data is pulled down in response to the second adjustment signal.

In another example, an optical communication system includes an optical-to-electrical conversion circuit configured to produce first and second differential electrical data signals, at respective first and second electrical nodes, in response to a single-ended optical data signal. A termination circuit is coupled to the first and second electrical nodes. A first digital-to-analog converter (DAC) circuit is coupled to the first electrical node, the first DAC circuit comprising a first binary input and a first voltage output. A second DAC circuit is coupled to the second electrical node, the second DAC circuit comprising a second binary input and a second voltage output. A linear equalizer circuit is coupled to the termination circuit and the first and second DAC circuits, wherein the first and second DAC circuits are configured to adjust the first and second differential electrical data signals based on the respective first and second voltage outputs such that a zero-crossing point of positive data is pulled up and a zero-crossing point of negative data is pulled down.

In yet another example, a method for threshold adjustment compensation of optical noise when generating electrical data signals from an optical data signal includes converting the optical data signal to first and second differential electrical data signals. First and second threshold adjust signals are converted based on a default code and circuit characteristics. A zero-crossing point of the first and second differential data signals is adjusted based on the respective first and second threshold adjust signals such that the zero-crossing point of positive data is pulled up and the zero-crossing point of negative data is pulled down. The first and second differential data signals are equalized after the zero-crossing points of each signal has been adjusted to generate the electrical data signals.

DETAILED DESCRIPTION

The zero-crossing points of the differential data may be adjusted by using differential current DACs that bias relatively small (e.g., 50 Ohm) termination resistors. Due to the relatively small termination resistors, a relatively large current (e.g., 6 mA) is necessary to achieve a desirable 300 mV$_{pp}$ threshold adjustment. If additional threshold adjustment is necessary, an even larger current is used. Unfortunately, this high power consumption is not acceptable in a new generation of optical modules.

The disclosed embodiments use two substantially identical voltage-mode DAC circuits (e.g., R-2R DAC) at an optical receiver front end. Each DAC circuit is coupled to a respective differential input node. The DAC circuits may generate adjustment signals to set the positive and negative inputs of a linear equalizer circuit to different zero-crossing points. For example, the zero-crossing point of positive data may be pulled up while the zero-crossing point of negative data may be pulled down. To isolate the effect of a termination voltage, two internal alternating current (AC) coupling capacitances may be inserted between termination resistors and the linear equalizer circuit. Additionally, two relatively high value resistances may be inserted between internal AC coupling capacitances and the DACs in order to reduce the signal direct current (DC) wandering due to limited internal AC coupling capacitance. Using this threshold adjustment circuit, the dissipated current can be reduced to less than 1 mA while decreasing the bit error rate for optical data.

Figure 1:
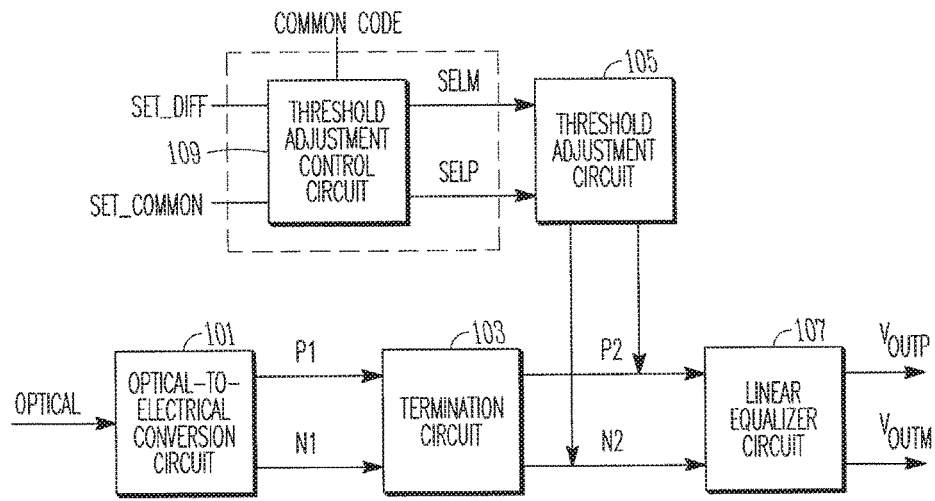
FIG. 1 is a block diagram of an optical data circuit having a threshold adjustment circuit to compensate for asymmetrical optical noise, according to example embodiments.

FIG. 1 is a block diagram of an optical data circuit having a threshold adjustment circuit to compensate for asymmetrical optical noise, according to example embodiments. The circuit includes an optical-to-electrical conversion circuit 101, a termination circuit 103, a threshold adjustment circuit 105, a threshold adjustment control circuit 109, and a linear equalizer circuit 107.

The optical-to-electrical conversion circuit 101 includes a single-ended optical fiber input and first and second differential electrical nodes P1 and N1. The optical-to-electrical conversion circuit 101 may comprise any means to generate differential electrical signals in response to the optical input. For example, the optical-to-electrical conversion circuit 101 may comprise a photo diode to generate electrical signals from light signals.

Figure 2:
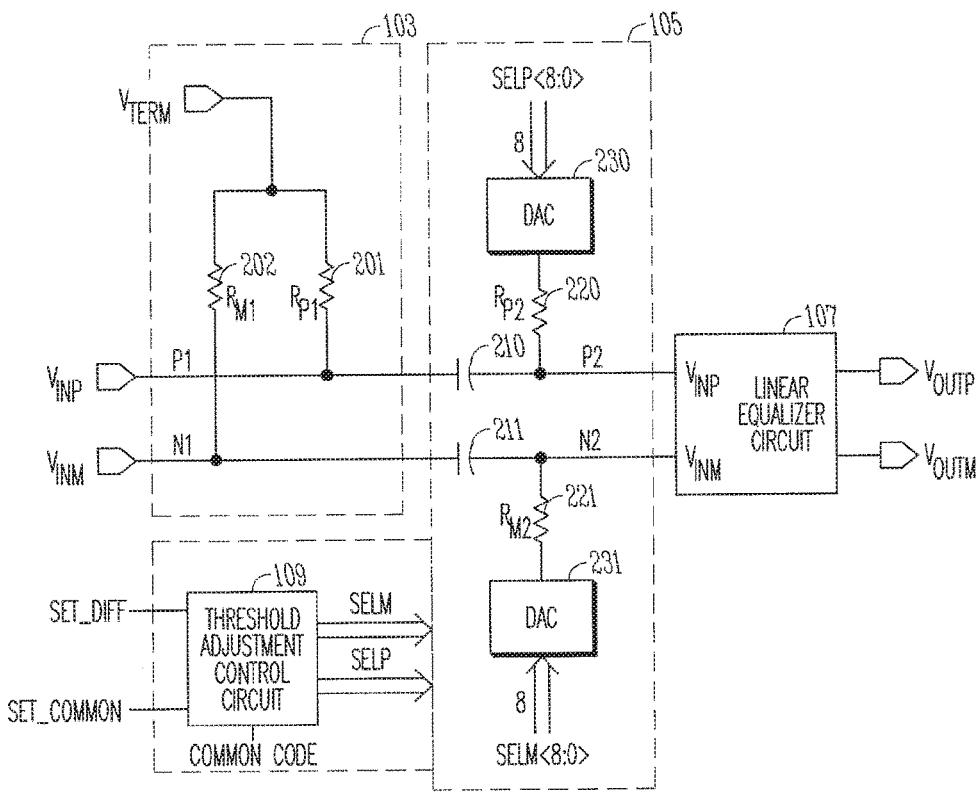
FIG. 2 is a schematic diagram of an implementation of the threshold adjustment circuit to compensate for asymmetrical optical noise, according to the embodiment of FIG. 1.

The optical-to-electrical conversion circuit 101 provides differential output signals on nodes P1 and N1. The termination circuit 103 is coupled to the P1 and N1 nodes to pull the nodes up to a termination voltage $V_{TERM}$ (e.g., 3V to 5V), as illustrated in FIG. 2.

The termination circuit 103 provides the terminated differential output signals on nodes P2 and N2 that are coupled to respective $V_{INP}$ and $V_{INM}$ input nodes of the linear equalizer circuit 107.

Linear equalizer circuit 107 provides equalization to the differential input signals on respective P2 and N2 input nodes. The equalization reverses the distortion incurred by a signal transmitted through an optical channel and balances the differential electrical signals. The linear equalizer circuit 107 renders the frequency response of the differential signals flat from end-to-end. When a channel has been equalized, the frequency domain attributes of the signal at the input are faithfully reproduced at the output. The linear equalizer circuit 107 also cancels out any group delay and phase delay between different frequency components.

The threshold adjustment circuit 105 is coupled to the P2 and N2 nodes of the termination circuit 103. A threshold adjustment control circuit 109 may be coupled to the threshold adjustment circuit 105 or may be part of the threshold adjustment circuit 105. The threshold adjustment control circuit 109 provides select control words SELM and SELP to the DACs of the threshold adjustment circuit 105 as described subsequently in greater detail.

In operation, the optical-to-electrical conversion circuit 101 accepts a single-ended optical data signal from the optical input and converts the light signal to a representative electrical data signal (e.g., voltage signal). In the illustrated embodiment, the optical-to-electrical conversion circuit 101 converts the optical signal to differential output voltages on the P1 and N1 nodes.

The termination circuit 103 pulls the P1 and N1 nodes up to a termination voltage $V_{TERM}$. The threshold adjustment circuit 105 adjusts the voltages at the P2 and N2 nodes so that the zero-crossing point of the positive data (i.e., P2) is pulled up while the zero-crossing point of the negative data (i.e., N2) is pulled down.

FIG. 2 is a schematic diagram of an implementation of the threshold adjustment circuit to compensate for asymmetrical optical noise, according to the embodiment of FIG. 1. The implementation schematic of FIG. 2 is for purposes of illustration as other components or topologies may be used to accomplish the same or similar functions.

The termination circuit 103 comprises a resistance 201 (e.g., resistor) labeled $R_{P1}$ is coupled between the P1 node at $V_{INP}$ and the $V_{TERM}$ node (e.g., power supply node) such that the positive differential voltage line is pulled up to $V_{TERM}$. The $V_{TERM}$ voltage is a DC biasing voltage and at the same time it is also an AC ground as long as its impedance is low enough thus, in the illustrated embodiment, $V_{TERM}$ is a relatively low impedance. A resistance 202 (e.g., resistor) labeled $R_{P2}$ is coupled between the N1 node at $V_{INM}$ and the $V_{TERM}$ node such that the negative differential voltage line is pulled up to $V_{TERM}$. A first capacitance 210 is coupled to the P1 node and the resistance 201 and the linear equalizer circuit's $V_{INP}$ input node P2. A second capacitance 211 is coupled to the N1 node and the resistance 202 and the linear equalizer circuit's $V_{INM}$ input node N2. The resistances 201, 202 are input termination resistances and are decoupled from the threshold adjustment circuit 105 through the AC coupling capacitances 210, 211, respectively. Thus, the termination voltage (e.g., $V_{TERM}$) will not affect the threshold adjustment at the input to the linear equalizer circuit 107.

The threshold adjustment circuit 105 includes a first DAC 230 coupled to the P2 node through a resistance 220 (e.g., resistor) labeled $R_{P2}$ and a second DAC 231 coupled to the N2 node through a resistance 221 (e.g., resistor) labeled $R_{M2}$. Due to a limited capacitance (e.g., 8 picofarads (pF)) of any on-die AC-coupling capacitances, the resistance values of the resistances 220, 221 should be large enough (e.g., approximately 400 k OHM) to avoid DC signal drift at the input to the linear equalizer circuit 107. In DC signal drift, the DC component in a signal cannot remain constant and begins to oscillate at very low frequencies if resistances 220, 221 are too small.

A first select word (e.g., SELP) is input to the first DAC 230 to control the voltage at the output of the DAC 230. A second select word (e.g., SELM) is input to the second DAC 231 to control the voltage at the output of the DAC 231. The select words SELM, SELP are generated by the threshold adjustment control circuit 109 that is coupled to or may be part of the threshold adjustment circuit 105. The select words SELM, SELP are used by their respective DACs to select certain resistances in order to generate an output voltage $V_{OUT}$ to pull up the zero-crossing point of the positive data on the P2 node and pull down the zero-crossing point of the negative data on the N2 node. The benefits of this operation are illustrated in the plot of FIG. 3 as discussed subsequently.

Figure 4:
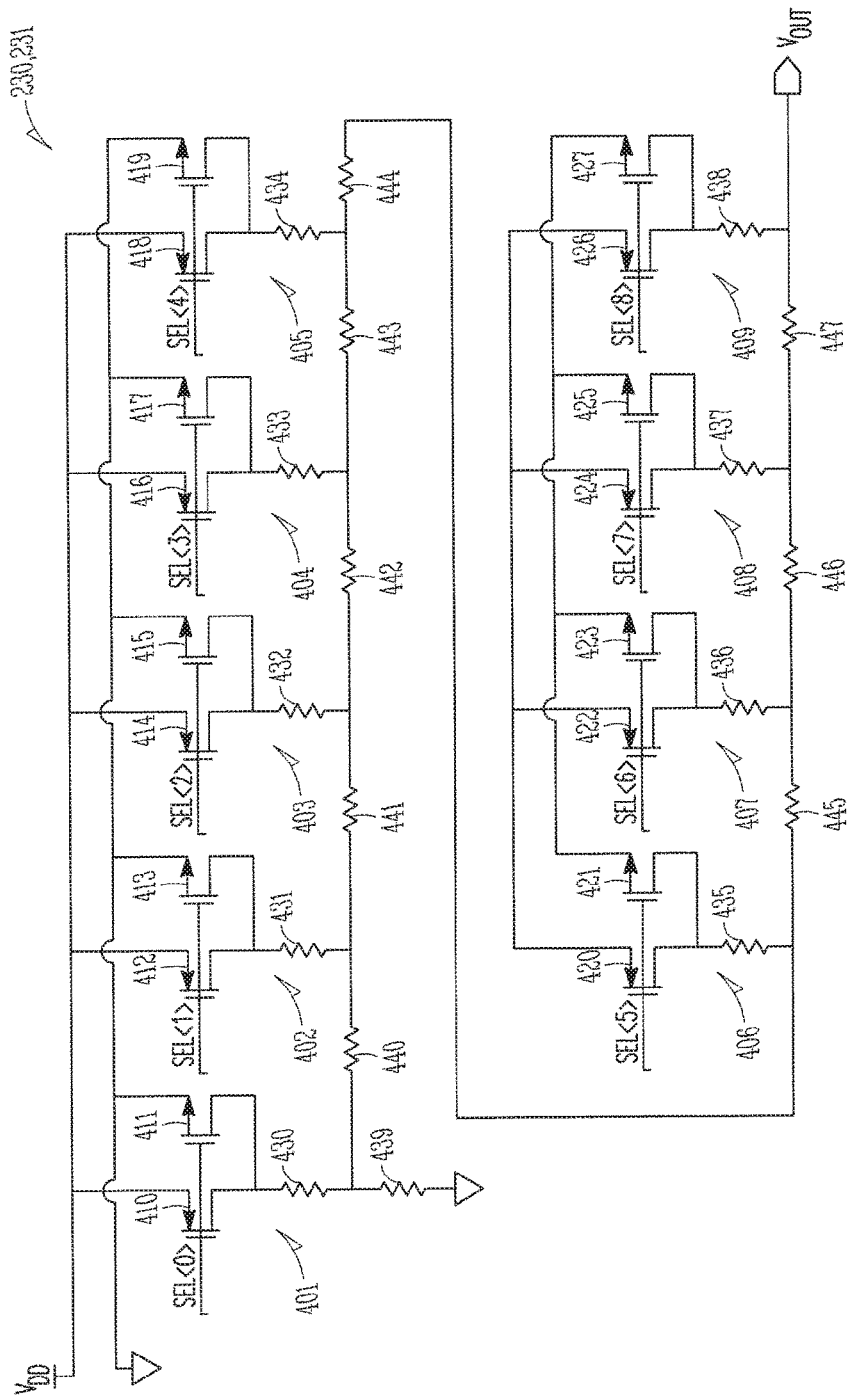
FIG. 4 is a schematic diagram of an R-2R digital-to-analog converter (DAC) circuit, according to example embodiments.

In an embodiment, the DACs 230, 231 are described as an R-2R DAC, such as shown in FIG. 4 and described subsequently. In alternative embodiments, other types of DACs may be used. The various embodiments are not limited to any one type of DAC.

The voltage outputs of the voltage mode DACs 230, 231 are determined by $V_{OUT}=(V_{DD}*VAL)/2^N$, where N is a number of bits used by the DAC and VAL is in a range of 0 to approximately $2^N-1$. Since $V_{OUT}$ is not dependent on current consumed, relatively large R-2R resistances (e.g., 15k OHM-2*15 k OHM) in the DAC may be used to significantly reduce current consumption by the DACs to less than approximately 1 mA while an approximately 300 $mV_{pp}$ threshold adjustment may be achieved.

Figure 3:
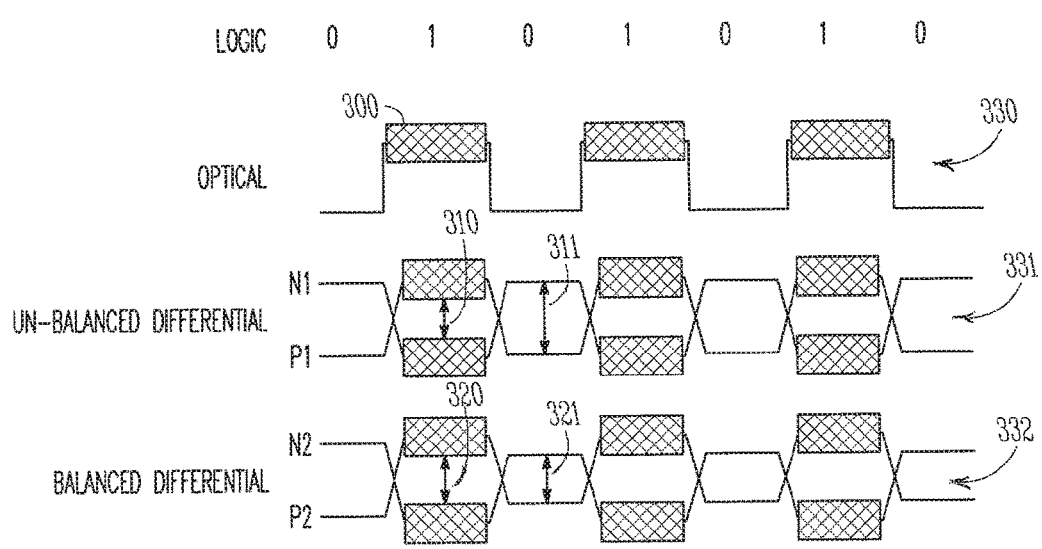
FIG. 3 is a signal diagram of single ended optical input and resulting unbalanced and balanced differential outputs, according to example embodiments.

FIG. 3 is a signal diagram of a single ended optical input and resulting unbalanced and balanced differential outputs, according to example embodiments. The top line shown generally at 330 shows the input logical data (e.g., 0101010). The second line 331 shows the optical signal that is representative of the input logical data. Each of the positive pulses that represent the logical 1 data may include noise 300 that may cause problems with the linear equalization.

The unbalanced differential data 331 shows the differential data at the P1 and N1 nodes of FIG. 1. This plot shows that the eye height 310 for the differential bit "1" is much smaller than the eye height 311 for the differential bit "0", where the eye height may be defined as a magnitude difference between the P1 and N1 signals when P1 is at a maximum voltage and N1 is at a minimum voltage or P1 is at a minimum voltage and N1 is at a maximum voltage.

The balanced differential data 332 shows the differential data at the P2 and N2 nodes of FIGS. 1 and 2. This plot shows that the threshold adjustment circuit has pulled up the zero-crossing point of the positive data on the P2 node and pulled down the zero-crossing point of the negative data on the N2 node so that the eye heights 320, 321 of the respective differential bits "1" and "0" are balanced to substantially the same level resulting in improved equalization and bit error rate for the output data.

FIG. 4 is a schematic diagram of an R-2R digital-to-analog converter (DAC) circuit, according to the embodiments of FIGS. 1 and 2. Substantially identical, respective DAC circuits, as illustrated FIG. 4, are used for the positive voltage DAC 230 and the negative voltage DAC 231.

The R-2R DAC of FIG. 4 is for purposes of illustration only of one type of DAC that may be used in the threshold adjustment circuit 105. The present embodiments are not limited to any one type of DAC.

The DAC includes a plurality of selection circuits 401-409 that each include an n-type field effect transistor (NFET) 411, 413, 415, 417, 419, 421, 423, 425, 427 and a p-type FET (PFET) 410, 412, 414, 416, 418, 420, 422, 424, 426. The source of each NFET 411, 413, 415, 417, 419, 421, 423, 425, 427 is coupled to circuit common node (e.g., ground) while the source of each PFET 410, 412, 414, 416, 418, 420, 422, 424, 426 is coupled to a power supply node (e.g., $V_{DD}$).

Each selection circuit 401-409 is coupled in series with a respective resistor 430-438 with resistance 2R. Resistors 440-447 with resistance R are coupled between adjacent selection circuit resistors 430-438. Pairs of these resistors 430-447 are coupled in eight different voltage divider circuits.

The control gates of each of the transistors 410-427 are coupled to a respective bit of the respective input select control word (SELM, SELP). The state of that particular bit controls the activation/deactivation of its respective transistors. For example, a logical "0" in SEL<0> would turn on transistor 410 and turn off transistor 411 so that current would flow in the circuit comprising transistor 410, resistor 430, and resistor 439 whose resistance is 2R. Thus, this circuit would then be a voltage divider circuit to produce a voltage at the node between resistor 430 and resistor 439. The other selection circuits 401-409 operate in a similar manner so that the logic state of the bit coupled to the respective selection circuit 401-409 causes different voltage divider circuits to be activated to adjust the voltage output $V_{OUT}$ of the DAC. A logical "1" in SEL<0> would turn off transistor 410 and turn on transistor 411 so resistance 430 is coupled to ground. In another embodiment, the NFETs 411, 413, 415, 417, 419, 421, 423, 425, 427 may be coupled to $V_{DD}$ while the PFETs 410, 412, 414, 416, 418, 420, 422, 424, 426 are coupled to ground in order to provide an opposite operation in response to the logical "0" and "1" control signals.

Figure 5:
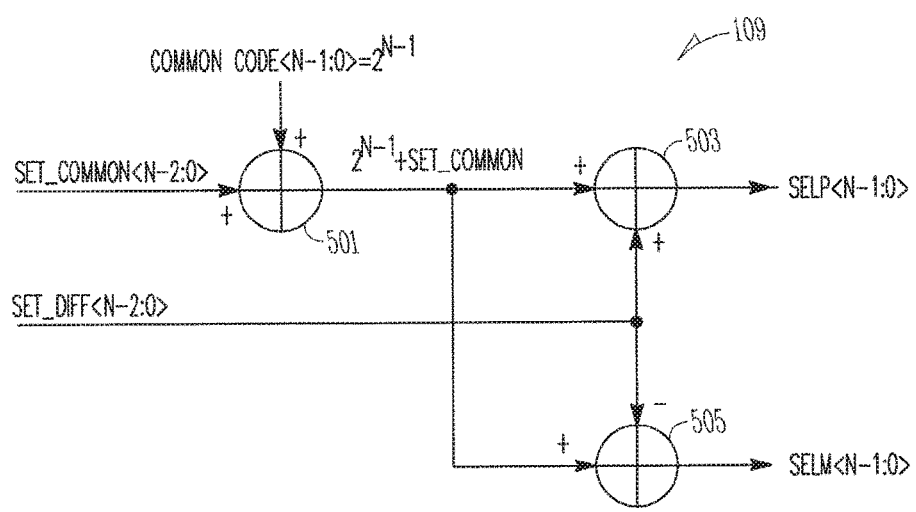
FIG. 5 is a logic diagram of a threshold adjustment control circuit, according to example embodiments.

FIG. 5 is a logic diagram of a threshold adjustment control circuit 109, according to example embodiments. This diagram is for purposes of illustration only as other ways to generate the selection words SELP and SELM for the DACs may be used.

SET_COMMON and SET_DIFF are input values to the threshold adjustment control circuit 109. These values are set by a user of the circuit to change its behavior based on circuit characteristics (e.g., DAC resolution, $V_{DD}$) and desired performance of the adjustment. SET_COMMON represents a value input by the user based on the general common circuit deviation characteristics and/or DAC resolution, power supply voltage. SET_DIFF represents a value input by the user for the desired voltage difference that the positive data signal is pulled up and the negative data signal is pulled down.

For example, the present embodiments disclose a full range of the DAC as being from 0V to $V_{DD}*((2^N-1)/(2^N))$ which is approximately $V_{DD}$. In this case, the 2's complement binary value having N−1 bits SET_COMMON may be set between negative $V_{DD}/4$ which is $-V_{DD}*((2^{N-2}-1)/(2N))$ to positive $V_{DD}/4$ which is $+V_{DD}*((2^{N-2}-1)/(2^N))$.

The logic diagram includes a hard-wired, default common code (i.e., COMMON_CODE<N−1:0>=$2^{N-1}$) that represents designed common circuit characteristics and can be hardwired (e.g., stored) to be any value between 0 to $2^{N-1}$ during circuit design stage). The SET_COMMON code is summed to COMMON_CODE at 501 to generate a calculated common code of COMMON_CODE (e.g., $2^{N-1}$)+SET_COMMON.

The calculated common code is added at 503 to a two's complement binary number having N−1 bits and representing the common mode deviation from the common code (i.e., SET_DIFF<N−2:0>). The sum of these values is the SELP<N−1:0> select word. This operation may be represented by SELP=COMMON_CODE (e.g., $2^{N-1}$)+SET_COMMON+SET_DIFF.

The SET_DIFF<N−2:0> value is also subtracted from the calculated common code COMMON_CODE (e.g., $2^{N-1}$)+SET_COMMON at 505. This operation generates the SELM<N−1:0> select word. This operation may be represented by SELM=COMMON_CODE (e.g., $2^{N-1}$)+SET_COMMON−SET_DIFF.

One example of operation of the threshold adjustment control circuit may assume that N=9 (e.g., for a 9-bit DAC) so that $2^N$=512. Thus, the hard-wired common code=$2^8$=256, the SET_COMMON=0, and the SET_DIFF=0. Thus, SELP=$2^8$ and SELM=$2^8$. Using a 9-bit DAC as illustrated in FIG. 4 would result in a DAC output voltage for the P2 node of P2=$V_{DD}*(2^8/2^9)$=$V_{DD}/2$ and an output voltage for the N2 node of N2=$V_{DD}*(2^8/2^9)$=$V_{DD}/2$.

In another example of operation of the threshold adjustment control circuit may assume that N=9 and the hard-wired common code=$2^8$=256. The SET_COMMON=10, and SET_DIFF=16. Thus, SELP=$2^8$+10+16=282 and SELM=$2^8$+10−16=250. Using the 9-bit DAC of FIG. 4 would result in a DAC output voltage for the P2 node of P2=$V_{DD}*(282/2^9)$=$V_{DD}*(282/512)$ and an output voltage for the N2 node of N2=$V_{DD}*(250/2^9)$=$V_{DD}*(250/512)$.

Figure 6:
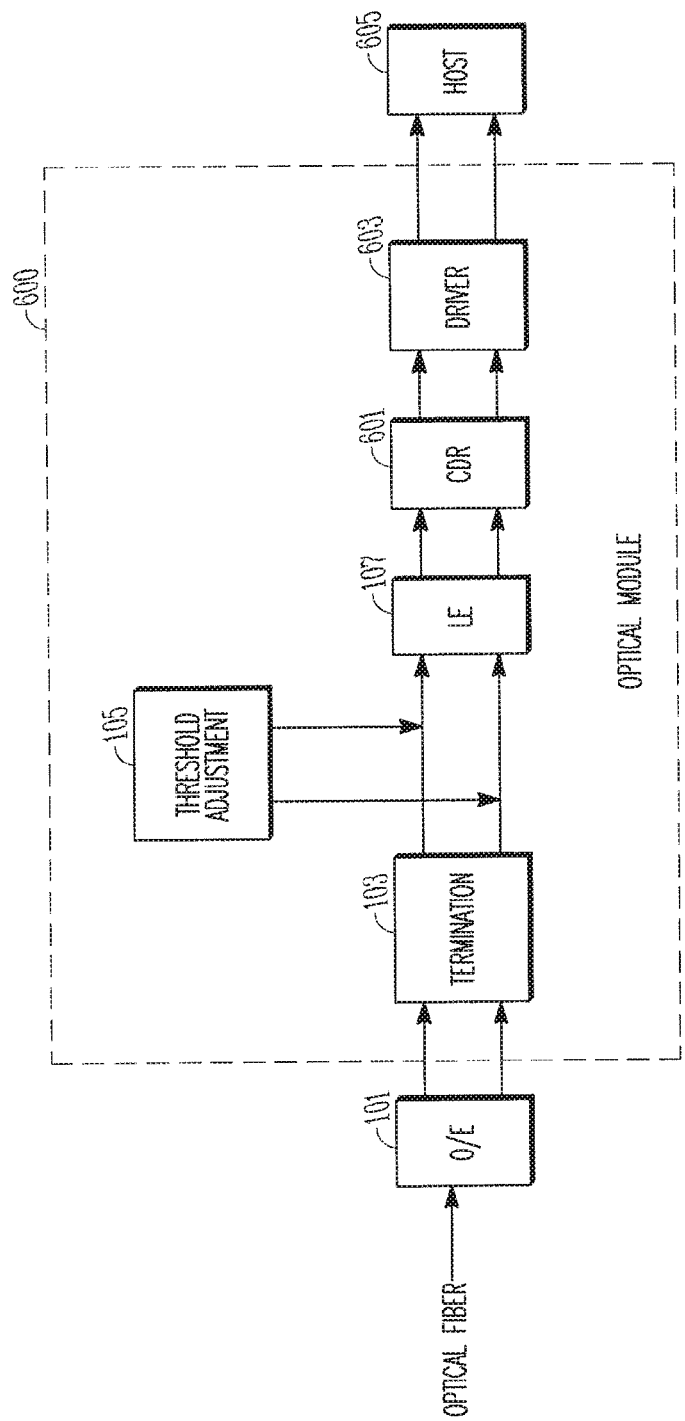
FIG. 6 is a block diagram of an optical module system incorporating the threshold adjustment circuit, according to example embodiments.

FIG. 6 is a block diagram of an optical module system 600 incorporating the threshold adjustment circuit 105, according to example embodiments. The optical module block diagram is for purposes of illustrating one use of the threshold adjustment circuit 105. Other embodiments may use the circuit 105 for other uses.

The optical module 600 may be used in an optical communication system where optical data is transmitted over optical fiber to the optical-to-electrical conversion circuit 101. The optical-to-electrical conversion circuit 101 converts the single-ended optical data signal to a differential electrical data signal that is input through the termination circuit 103 to the linear equalizer circuit 107. The threshold adjustment circuit 105, with an integral controller in an embodiment, provides the pull up of the zero-crossing point of the positive data and the pull down of the zero-crossing point of the negative data.

The resulting data signals are equalized and input to the clock and data recover circuit 601 to re-time the differential electrical data signals. The re-timed signals are input to a driver circuit 603 for transmission to a host 605 for interpretation and/or storage of the data. The host 605 may be a computer or some kind of controller.

Figure 7:
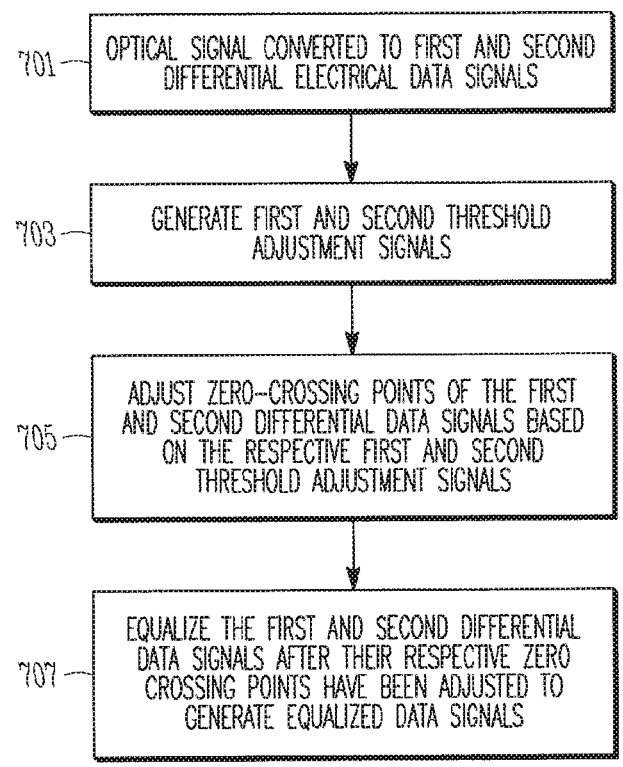
FIG. 7 is a flowchart of a method for threshold adjustment compensation of optical noise when generating electrical data signals from an optical data signal, according to example embodiments.

FIG. 7 is a flowchart of a method for threshold adjustment compensation of optical noise when generating electrical data signals from an optical data signal, according to example embodiments. In block 701, the optical data signal is converted to first and second differential electrical data signals through the optical-to-electrical conversion circuit. After the termination circuit, in block 703, first and second threshold adjust signals are generated based on circuit characteristics. In block 705, a zero-crossing point of the first and second differential data signals is adjusted based on the respective first and second threshold adjust signals such that the zero-crossing point of the positive data signal is pulled up and the zero-crossing point of the negative data signal is pulled down. In block 707, the first and second differential electrical data signals are equalized after the zero-crossing points of each signal has been adjusted in order to generate the electrical data signals.

Figure 8:
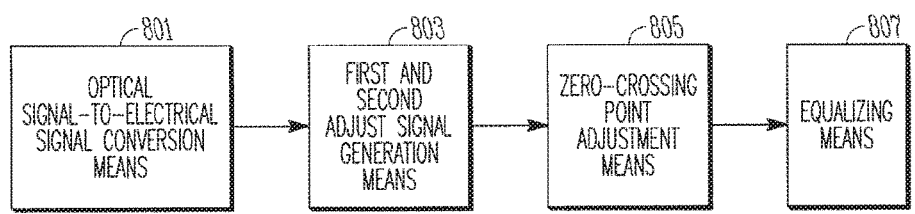
FIG. 8 is a block diagram of a threshold adjustment compensation apparatus, according to example embodiments.

FIG. 8 is a block diagram of a threshold adjustment compensation apparatus, according to example embodiments. Block 801 of the apparatus comprises optical signal-to-electrical signal conversion means for converting an optical data signal to first and second differential electrical data signals. For example, this means may include any optical signal-to-electrical signal conversion device such as a photo diode to generate electrical signals in response to the optical signals.

In block 803, the apparatus includes first and second threshold adjust signal generation means for generating first and second threshold adjust signals based on a default code and circuit characteristics. For example, this means may include a circuit such as one illustrated in FIG. 5.

In block 805, the apparatus includes zero-crossing point adjustment means for adjusting a zero-crossing point of the first and second differential data signals based on the respective first and second threshold adjust signals such that the zero-crossing point of positive data is pulled up and the zero-crossing point of negative data is pulled down. For example, this means may include one or more DAC circuits.

In block 807, the apparatus includes equalizing means for equalizing the first and second differential data signals after the zero-crossing points of each signal has been adjusted to generate the electrical data signals. For example, this means may include any circuit configured to equalize signals.

The following examples list additional aspects of the various embodiments of the invention.

Example 1 is an optical data circuit comprising: an optical-to-electrical conversion circuit configured to produce first and second differential electrical data signals, at respective first and second electrical nodes, in response to an optical data signal; a first digital-to-analog converter (DAC) circuit coupled to the first electrical node and configured to generate a first adjustment signal; and a second DAC circuit coupled to the second electrical node and configured to generate a second adjustment signal; wherein the first and second DAC circuits are configured to adjust the first and second differential electrical data signals such that a zero-crossing point of a positive data signal is pulled up in response to the first adjustment signal and a zero-crossing point of a negative data signal is pulled down in response to the second adjustment signal.

In Example 2, the subject matter of Example 1 optionally includes R DAC circuits comprising a plurality of selection circuits to select a respective resistor voltage divider circuit in response to a respective first or second select control word.

In Example 3, which may include the subject matter of any one or more of Examples 1-2, optionally includes a threshold adjustment control circuit coupled to the first and second DAC circuits, the threshold adjustment control circuit configured to generate first and second select control words.

In Example 4, which may include the subject matter of any one or more of Example 1-3, optionally includes wherein the threshold adjustment control circuit is configured to generate the first and second select control words based on a hard-wired default code and circuit characteristics.

In Example 5, which may include the subject matter of any one or more of Example 1-4, optionally includes wherein the first DAC circuit adjusts the zero-crossing point of the positive data in response to the first select control word and the second DAC circuit adjusts the zero-crossing point of the negative data in response to the second select control word.

In Example 6, which may include the subject matter of any one or more of Examples 1-5, optionally include a termination circuit coupled to the first and second electrical nodes.

In Example 7, which may include the subject matter of any one or more of Examples 1-6, optionally includes a first capacitance coupled between the first electrical node and the first DAC circuit; and a second capacitance coupled between the second electrical node and the second DAC circuit.

In Example 8, which may include the subject matter of any one or more of Examples 1-7, optionally includes wherein each of the first and second DAC circuits is respectively coupled to the first and second capacitances through a respective first and second resistance.

In Example 9, which may include the subject matter of any one or more of Examples 1-8, optionally includes wherein the first and second resistances comprise a resistance value large enough to avoid signal DC wandering of the positive and negative data at respective inputs to a linear equalizer circuit.

Example 10 is an optical communication system comprising: an optical-to-electrical conversion circuit configured to produce first and second differential electrical data signals, at respective first and second electrical nodes, in response to a single-ended optical data signal; a termination circuit coupled to the first and second electrical nodes; a first digital-to-analog converter (DAC) circuit coupled to the first electrical node, the first DAC circuit comprising a first binary input and a first voltage output; a second DAC circuit coupled to the second electrical node, the second DAC circuit comprising a second binary input and a second voltage output; and a linear equalizer circuit coupled to the termination circuit and the first and second DAC circuits; and wherein the first and second DAC circuits are configured to adjust the first and second differential electrical data signals based on the respective first and second voltage outputs such that a zero-crossing point of a positive data signal is pulled up and a zero-crossing point of a negative data signal is pulled down.

In Example 11, the subject matter of Example 10 optionally includes a clock and data recovery circuit coupled to differential outputs of the linear equalizer circuit, the clock and data recovery circuit configured to re-time the differential electrical data signals.

In Example 12, which may include the subject matter of any one or more of Examples 10-11, optionally includes a driver circuit coupled to the clock and data recovery circuit, the driver circuit configured to transmit the re-timed differential electrical data signals to a host.

In Example 13, which may include the subject matter of any one or more of Examples 10-12, optionally include wherein the termination circuit comprises a first resistance coupled between the first electrical node and a power supply node and a second resistance coupled between the second electrical node and the power supply node.

In Example 14, which may include the subject matter of any one or more of Examples 10-13, optionally include a threshold adjustment control circuit coupled to the first and second DAC circuits and configured to generate positive and negative select words respectively at the first and second binary inputs.

Example 15 is a method for threshold adjustment compensation of optical noise when generating electrical data signals from an optical data signal, the method comprising: converting the optical data signal to first and second differential electrical data signals; generating first and second threshold adjust signals based on a default code and circuit characteristics; adjusting a zero-crossing point of the first and second differential data signals based on the respective first and second threshold adjust signals such that the zero-crossing point of positive data is pulled up and the zero-crossing point of negative data is pulled down; and equalizing the first and second differential data signals after the zero-crossing points of each signal has been adjusted to generate the electrical data signals.

In Example 16, the subject matter of Example 15 optionally includes re-timing the electrical data signals to recover the positive and negative data.

In Example 17, which may include the subject matter of any one or more of Examples 15-16, optionally include wherein generating the first and second threshold adjust signals comprises: receiving a value representative of common circuit deviation characteristics; receiving a value of the desired voltage difference; adding the value representative of the common circuit deviation characteristics to a stored common circuit characteristics code and the value of the desired voltage difference to generate a positive select control word; and subtracting the value of the desired voltage difference from the sum of the value representative of the common circuit deviation characteristics and the stored common circuit characteristics code to generate a negative select control word.

In Example 18, which may include the subject matter of any one or more of Examples 15-17, optionally includes generating the first threshold adjust signal by a first digital-to-analog converter (DAC) circuit with the positive select control word.

In Example 19, which may include the subject matter of any one or more of Examples 15-18 optionally includes generating the second threshold adjust signal by a second DAC circuit with the negative select control word.

In Example 20, which may include the subject matter of any one or more of Examples 15-19, optionally includes wherein the positive select control word and the negative select control word selects one or more of a plurality of voltage divider circuits in the first or second DAC circuits to generate the first or second adjust signals.

In the previous description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. An optical data circuit comprising:
   an optical-to-electrical conversion circuit configured to produce first and second differential electrical data signals, at respective first and second electrical nodes, in response to an optical data signal;
   a first digital-to-analog converter (DAC) circuit coupled to the first electrical node and configured to generate a first adjustment signal; and
   a second DAC circuit coupled to the second electrical node and configured to generate a second adjustment signal;
   wherein the first and second DAC circuits are configured to adjust the first and second differential electrical data signals such that a zero-crossing point of a positive data signal is pulled up in response to the first adjustment signal and a zero-crossing point of a negative data signal is pulled down in response to the second adjustment signal.

2. The circuit of claim 1, wherein the first and second DAC circuits include first and second R-2R DAC circuits comprising a plurality of selection circuits to select a respective resistor voltage divider circuit in response to a respective first or second select control word.

3. The circuit of claim 2, further comprising a threshold adjustment control circuit coupled to the first and second DAC circuits, the threshold adjustment control circuit configured to generate first and second select control words.

4. The circuit of claim 3, wherein the threshold adjustment control circuit is configured to generate the first and second select control words based on a hard-wired default code and circuit characteristics.

5. The circuit of claim 4, wherein the first DAC circuit adjusts the zero-crossing point of the positive data in response to the first select control word and the second DAC circuit adjusts the zero-crossing point of the negative data in response to the second select control word.

6. The circuit of claim 1, further comprising a termination circuit coupled to the first and second electrical nodes.

7. The circuit of claim 6, further comprising:
a first capacitance coupled between the first electrical node and the first DAC circuit; and
a second capacitance coupled between the second electrical node and the second DAC circuit.

8. The circuit of claim 7, wherein each of the first and second DAC circuits is respectively coupled to the first and second capacitances through a respective first and second resistance.

9. The circuit of claim 8, wherein the first and second resistances comprise a resistance value large enough to avoid signal DC wandering of the positive and negative data at respective inputs to a linear equalizer circuit.

10. An optical communication system comprising:
an optical-to-electrical conversion circuit configured to produce first and second differential electrical data signals, at respective first and second electrical nodes, in response to a single-ended optical data signal;
a termination circuit coupled to the first and second electrical nodes;
a first digital-to-analog converter (DAC) circuit coupled to the first electrical node, the first DAC circuit comprising a first binary input and a first voltage output;
a second DAC circuit coupled to the second electrical node, the second DAC circuit comprising a second binary input and a second voltage output; and
a linear equalizer circuit coupled to the termination circuit and the first and second DAC circuits; and
wherein the first and second DAC circuits are configured to adjust the first and second differential electrical data signals based on the respective first and second voltage outputs such that a zero-crossing point of a positive data signal is pulled up and a zero-crossing point of a negative data signal is pulled down.

11. The system of claim 10, further comprising a clock and data recovery circuit coupled to differential outputs of the linear equalizer circuit, the clock and data recovery circuit configured to re-time the differential electrical data signals.

12. The system of claim 11, further comprising a driver circuit coupled to the clock and data recovery circuit, the driver circuit configured to transmit the re-timed differential electrical data signals to a host.

13. The system of claim 10, wherein the termination circuit comprises a first resistance coupled between the first electrical node and a power supply node and a second resistance coupled between the second electrical node and the power supply node.

14. The system of claim 10, further comprising a threshold adjustment control circuit coupled to the first and second DAC circuits and configured to generate positive and negative select words respectively at the first and second binary inputs.

15. A method for threshold adjustment compensation of optical noise when generating electrical data signals from an optical data signal, the method comprising:
converting the optical data signal to first and second differential electrical data signals;
generating first and second threshold adjust signals based on a default code and circuit characteristics;
adjusting a zero-crossing point of the first and second differential data signals based on the respective first and second threshold adjust signals such that the zero-crossing point of positive data is pulled up and the zero-crossing point of negative data is pulled down; and
equalizing the first and second differential data signals after the zero-crossing points of each signal has been adjusted to generate the electrical data signals.

16. The method of claim 15, further comprising re-timing the electrical data signals to recover the positive and negative data.

17. The method of claim 15, wherein generating the first and second threshold adjust signals comprises:
receiving a value representative of common circuit deviation characteristics;
receiving a value of the desired voltage difference;
adding the value representative of the common circuit deviation characteristics to a stored common circuit characteristics code and the value of the desired voltage difference to generate a positive select control word; and
subtracting the value of the desired voltage difference from the sum of the value representative of the common circuit deviation characteristics and the stored common circuit characteristics code to generate a negative select control word.

18. The method of claim 17, further comprising generating the first threshold adjust signal by a first digital-to-analog converter (DAC) circuit with the positive select control word.

19. The method of claim 18, further comprising generating the second threshold adjust signal by a second DAC circuit with the negative select control word.

20. The method of claim 19, wherein the positive select control word and the negative select control word selects one or more of a plurality of voltage divider circuits in the first or second DAC circuits to generate the first or second adjust signals.

* * * * *

UNITED STATES PATENT AND TRADEMARK OFFICE
CERTIFICATE OF CORRECTION

PATENT NO. : 10,097,266 B2
APPLICATION NO. : 15/429492
DATED : October 9, 2018
INVENTOR(S) : Gu et al.

Page 1 of 1

It is certified that error appears in the above-identified patent and that said Letters Patent is hereby corrected as shown below:

On the Title Page

In Column 2, under "Other Publications", Line 1, delete "Applcation" and insert --Application-- therefor On page 2, in Column 1, under "Other Publications", Line 1, delete "Applcation" and insert --Application-- therefor In the Specification In Column 6, Line 19, delete "-$V_{DD}*((2^{N-2}-1)/(2N))$" and insert -- -$V_{DD}*((2^{N-2}-1)/(2^N))$-- therefor In Column 6, Line 25, delete "stage)." and insert --stage.-- therefor Signed and Sealed this
Twenty-second Day of December, 2020

Andrei Iancu
*Director of the United States Patent and Trademark Office*